US009874595B2

(12) United States Patent
Kawamura et al.

(10) Patent No.: US 9,874,595 B2
(45) Date of Patent: Jan. 23, 2018

(54) INSULATION DETECTING DEVICE

(71) Applicant: YAZAKI CORPORATION, Minato-ku, Tokyo (JP)

(72) Inventors: Yoshihiro Kawamura, Shizuoka (JP); Ryosuke Arigaya, Shizuoka (JP)

(73) Assignee: YAZAKI CORPORATION, Minato-ku, Tokyo (JP)

(*) Notice: Subject to any disclaimer, the term of this patent is extended or adjusted under 35 U.S.C. 154(b) by 13 days.

(21) Appl. No.: 14/678,313

(22) Filed: Apr. 3, 2015

(65) Prior Publication Data
US 2015/0285851 A1 Oct. 8, 2015

(30) Foreign Application Priority Data

Apr. 3, 2014 (JP) ................. 2014-076658

(51) Int. Cl.
G01R 31/14 (2006.01)
G01R 31/02 (2006.01)
(Continued)

(52) U.S. Cl.
CPC ............ *G01R 31/14* (2013.01); *B60L 3/0069* (2013.01); *H02H 11/005* (2013.01);
(Continued)

(58) Field of Classification Search
CPC .... G01R 31/14; G01R 31/025; G01R 31/006; G01R 31/40; B60L 3/0069; H02H 11/005
See application file for complete search history.

(56) References Cited

U.S. PATENT DOCUMENTS

2004/0051534 A1* 3/2004 Kobayashi ......... G01R 31/3658
324/429
2011/0006781 A1 1/2011 Kawamura
(Continued)

FOREIGN PATENT DOCUMENTS

CN 102539961 A 7/2012
CN 102735983 A 10/2012
(Continued)

OTHER PUBLICATIONS

Communication dated Jun. 13, 2017, from the State Intellectual Property Office of the P.R.C., in counterpart Chinese application No. 201510154737.3.
(Continued)

Primary Examiner — Patrick Assouad
Assistant Examiner — Haidong Zhang
(74) Attorney, Agent, or Firm — Sughrue Mion, PLLC

(57) ABSTRACT

An insulation detecting device includes a flying capacitor that holds a charged voltage, and a measurement and calculation unit that measures the charged voltage of the flying capacitor and calculates a ground fault resistance formed between a direct-current power supply electrically insulated from a ground, and the ground, based on the measured voltage. The flying capacitor includes one or a plurality of first capacitors, one or a plurality of second capacitors connected with the first capacitor in parallel, and a parallel cancellation switch arranged between the first capacitor and the second capacitor, and which performs parallel connection, and cancellation of the parallel connection, between the first capacitor and the second capacitor. A capacitance of the flying capacitor is variably changed by turning on or turning off of the parallel cancellation switch.

8 Claims, 2 Drawing Sheets

(51) Int. Cl.
    *B60L 3/00*           (2006.01)
    *H02H 11/00*       (2006.01)
    *G01R 31/40*       (2014.01)
    *G01R 31/00*       (2006.01)

(52) U.S. Cl.
    CPC .......... *G01R 31/006* (2013.01); *G01R 31/025* (2013.01); *G01R 31/40* (2013.01)

(56) References Cited

U.S. PATENT DOCUMENTS

| | | |
|---|---|---|
| 2011/0012606 A1 | 1/2011 | Kawamura |
| 2012/0153966 A1* | 6/2012 | Kawamura .......... G01R 31/028 324/548 |
| 2012/0262183 A1 | 10/2012 | Kawamura |
| 2013/0082715 A1 | 4/2013 | Kawamura |
| 2013/0342215 A1 | 12/2013 | Kawamura |
| 2015/0219706 A1* | 8/2015 | Loftus .................. B60L 3/0069 324/503 |

FOREIGN PATENT DOCUMENTS

| | | |
|---|---|---|
| CN | 103080758 A | 5/2013 |
| CN | 103430039 A | 12/2013 |
| JP | 2004-170103 A | 6/2004 |
| JP | 3962990 B2 | 8/2007 |
| JP | 2010-060323 A | 3/2010 |

OTHER PUBLICATIONS

Communication dated Dec. 5, 2017, from the Japanese Patent Office in a counterpart Japanese Patent Application No. 2014-076658.

* cited by examiner

INSULATION DETECTING DEVICE

CROSS-REFERENCE TO RELATED APPLICATION(S)

The present application claims priority to and incorporates by reference the entire contents of Japanese Patent Application No. 2014-076658 filed in Japan on Apr. 3, 2014.

BACKGROUND OF THE INVENTION

1. Field of the Invention

The present invention relates to an insulation detecting device, and especially relates to an insulation detecting device suitable for insulation detection of an ungrounded direct-current power supply mounted on a vehicle that uses driving force by electricity.

2. Description of the Related Art

In recent electric vehicles or hybrid cars, a battery assembly as a high-power, high-output, and compact direct-current power supply (hereinafter, abbreviated as direct-current power supply) is mounted. The direct-current power supply is configured such that a plurality of battery cells having a positive electrode and a negative electrode is connected in series, and an output voltage is 200 V (volt) or more. Therefore, positive and negative power supply lines that are outputs of the direct-current power supply are configured to be electrically insulated from a vehicle (vehicle body), that is, the direct-current power supply is configured to be ungrounded. The vehicle (vehicle body) is configured not to be used as the ground of the direct-current power supply.

The vehicle having such a configuration is typically configured to monitor an output voltage of the direct-current power supply and to monitor an insulation state between the direct-current power supply and the vehicle (vehicle body) using an insulation measurement technology in a flying capacitor system, like an insulation detecting device described in Japanese Patent Application Laid-open No. 2004-170103, for example. The insulation detection device described in Japanese Patent Application Laid-open No. 2004-170103 is configured from a flying capacitor in a state of flying from a ground potential, that is, the ground, a plurality of resistances and diodes, and a plurality of switches that controls connection between the direct-current power supply and the flying capacitor and the plurality of resistances and diodes.

In the insulation detecting device, the switches are appropriately controlled, and the flying capacitor is charged in a state where one terminal of the flying capacitor is connected to a positive electrode of the direct-current power supply and the other terminal of the flying capacitor is connected to a negative electrode of the direct-current power supply, and a voltage (voltage corresponding to the output voltage) charged in the flying capacitor is measured. Following that, the switches are appropriately controlled, and the voltage charged in the flying capacitor is discharged. Next, the switches are appropriately controlled, and the flying capacitor is charged with the direct-current power supply in a state where the one terminal of the flying capacitor is grounded through a ground fault resistance, and a first voltage charged in the flying capacitor is measured, as measurement of a ground fault resistance measured voltage. Next, after the first voltage is discharged, the switches are appropriately controlled, and the flying capacitor is charged with the direct-current power supply, and a second voltage charged in the flying capacitor is measured in a state where the other terminal of the flying capacitor is grounded through the ground fault resistance. When the measurement is completed, the second voltage is discharged. Then, the insulation state, that is, existence or non-existence of ground fault of the direct-current power supply (including the power supply line connected to the direct-current power supply) is calculated based on the measured output voltage, first voltage, and second voltage of the direct-current power supply.

In the insulation detecting device described in Japanese Patent Application Laid-open No. 2004-170103, at the time of measurement of the first voltage and the second voltage, only one of terminals of the flying capacitor is connected to the power supply line of the direct-current power supply, and the flying capacitor is charged. Meanwhile, in the power supply line of the direct-current power supply, a capacitance called Y capacitor, that is, a capacitance associated with arrangement of a capacitor (noise removal capacitor) for removing high-frequency noises and the like, and a floating capacitance formed between the power supply line and the ground are formed. Therefore, in the insulation detecting device described in Japanese Patent Application Laid-open No. 2004-170103, to suppress an influence of an electric charge from the Y capacitor on the flying capacitor when the flying capacitor is charged with the direct-current power supply in a state where one or the other terminal of the flying capacitor is grounded through the ground fault resistance, a flying capacitor having a sufficiently larger capacitance than the Y capacitor needs to be used. However, to measure the output voltage of the direct-current power supply with high accuracy, the capacitor needs to be charged to a state of full charge or nearly full charge, and there is a problem that, when the flying capacitor having a large capacitance is used, an extremely long charge time is required.

Further, measurement in a short time rather than the measurement accuracy, like measurement in an insulation state immediately after a power supply of the vehicle is turned ON, or highly accurate measurement of the output voltage of the direct-current power supply in a short time are desired.

SUMMARY OF THE INVENTION

The present invention has been made in view of the above problems, and an objective of the present invention is to provide an insulation detecting device that can select measurement of the output voltage of the direct-current power supply and of the ground fault resistance in a short time, or highly accurate measurement of the output voltage of the direct-current power supply and of the ground fault resistance, according to the situation.

According to one aspect of the present invention, an insulation detecting device includes a flying capacitor configured to hold a charged voltage; and a measurement and calculation means configured to measure the charged voltage of the flying capacitor, and calculate a ground fault resistance formed between a direct-current power supply electrically insulated from a ground, and the ground, based on the measured voltage, wherein the flying capacitor includes one or a plurality of first capacitors, one or a plurality of second capacitors connected with the first capacitor in parallel, and a parallel cancellation switch arranged between the first capacitor and the second capacitor, and which performs parallel connection, and cancellation of the parallel connection, between the first capacitor and the second capacitor, and a capacitance of the flying capacitor is variably controlled by turning on or turning off of the parallel cancellation switch.

According to another aspect of the present invention, the insulation detecting device further includes a first switch arranged between one end of the flying capacitor and a positive electrode of the direct-current power supply; a second switch arranged between the other end of the flying capacitor and a negative electrode of the direct-current power supply; a third switch arranged between the one end of the flying capacitor and the ground; and a fourth switch arranged between the other end of the flying capacitor and the ground, wherein the charged voltages of the flying capacitor charged with a first path, a second path, and a third path are measured by the measurement and calculation means with a fourth path, the first path being formed by turning on of only the first and the second switches, the second path being formed by turning on of only the first and the fourth switches, the third path being formed by turning on of only the second and the third switches, and the forth path being formed by turning on of only the third and the fourth switches, and the measurement and calculation means calculates the ground fault resistance, based on the measured voltages of the charged voltages respectively charged in the flying capacitor in the first to the third paths.

According to still another aspect of the present invention, the capacitance of the flying capacitor at a time of the cancellation of the parallel connection between the first capacitor and the second capacitor is half or less than the capacitance of the flying capacitor at a time of the parallel connection between the first capacitor and the second capacitor.

According to still another aspect of the present invention, the insulation detecting device further includes a measurement mode configured to perform, in a state where the connection cancellation switch is kept off, full charge to the flying capacitor composed of only the first capacitor with the first path formed by turning on of the first and the second switches, measurement of the charged voltage of the flying capacitor fully charged with the fourth path formed by turning on of the third and the fourth switches, and calculation of an output voltage of the direct-current power supply, based on the measured voltage at the full charge measured by the measurement and calculation means.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment to which the present invention is applied will be described with reference to the drawings. Note that the same configuration elements are denoted with the same reference sign, and repetitive description is omitted in the description below.

Figure 1:
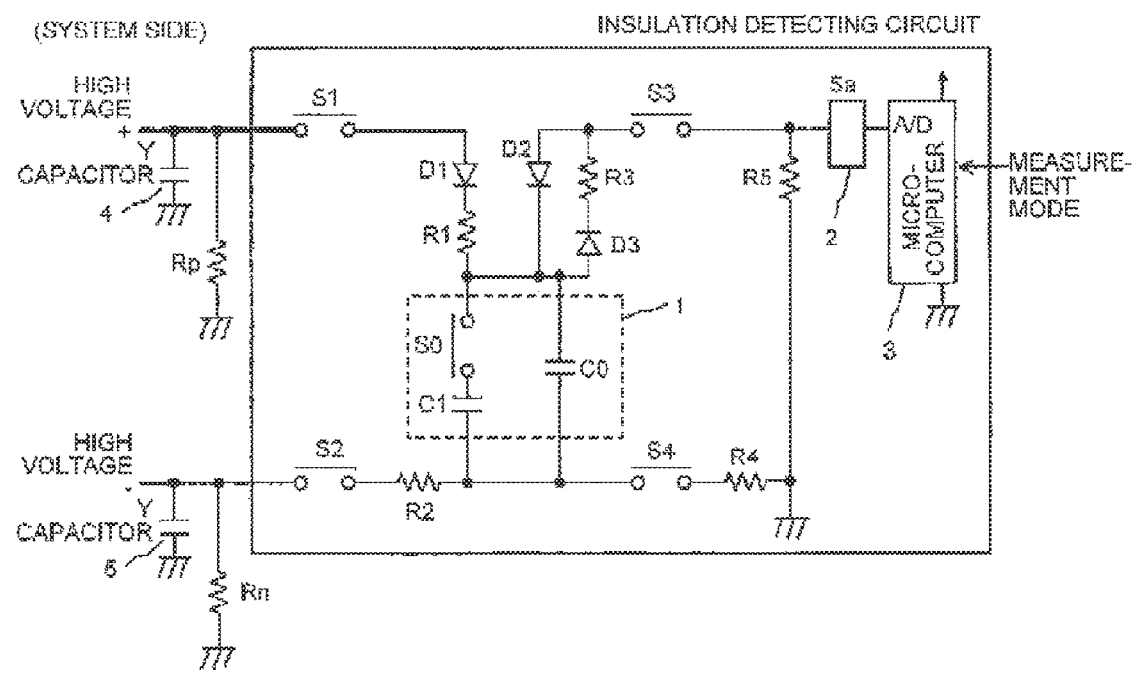
FIG. 1 is a diagram for describing a schematic configuration of an insulation detecting device as an embodiment of the present invention.

FIG. 1 is a diagram for describing a schematic configuration of an insulation detecting device as an embodiment of the present invention, and hereinafter, the insulation detecting device of the present embodiment will be described with reference to FIG. 1. Note that the insulation detecting device of the present embodiment has similar configurations to a conventional insulation detecting device except for a flying capacitor 1 formed of two capacitors C0 and C1 and a switch (parallel cancellation switch) S0, an operation of measurement control by a microcomputer 3. Therefore, in the description below, the flying capacitor 1 will be described in detail. Further, switches S0 to S4 are configured from known optical MOSFETs, for example and are ON/OFF controlled by the microcomputer 3.

Note that, in the description below, for clarification of the description, a side connected to the positive electrode of the direct-current power supply through the switch S1 (including the switch S0) is written as positive electrode terminal (positive electrode-side terminal), and a side connected to the negative electrode of the direct-current power supply through the switch S2 is written as negative electrode terminal (negative electrode-side terminal), among the terminals of the capacitors C0 and C1. At this time, as the capacitors C0 and C1, a known ceramic capacitor not having polarity is favorable. However, the capacitors C0 and C1 may be configured to use an electrolytic capacitor having a polarity.

As illustrated in FIG. 1, the insulation detecting device of the present embodiment is connected to a power supply line (illustrated by "high voltage +" in the drawing) connected to the positive electrode of the direct-current power supply (not illustrated) having a high voltage of 200 V (volts) or more, for example, and to a power supply line (illustrated by "high voltage −" in the drawing) connected to the negative electrode, respectively. At this time, the power supply line connected to the positive electrode of the direct-current power supply is connected to one end of the switch (first switch) S1, and the power supply line connected to the negative electrode is connected to one end of the switch (second switch) S2. With the configuration, a ground fault resistance RL composited and formed according to a virtual ground fault resistance Rp formed between the power supply line connected to the positive electrode of the direct-current power supply and the ground, and a virtual ground fault resistance Rn formed between the power supply line connected to the negative electrode and the ground is measured, and an output voltage that is a voltage between the positive electrode and the negative electrode of the direct-current power supply is measured.

Note that a Y capacitor 4 that is a virtual capacitance formed between the power supply line connected to the positive electrode of the direct-current power supply and the ground, and a Y capacitor 5 that is a virtual capacitance formed between the power supply line connected to the positive electrode of the direct-current power supply and the ground are formed.

The other end of the switch S1 is connected to a positive electrode terminal (an upper-side terminal in FIG. 1) of the capacitor C0 that forms the flying capacitor 1 through a diode D1 and a resistance R1, one end of the switch S0, a cathode of a diode D2, and an anode of a diode D3. The other end of the switch S0 is connected to a positive electrode terminal (an upper-side terminal in FIG. 1) of the capacitor (one capacitor) C1 having a larger capacitance than the capacitor (the other capacitor) C0.

Further, a cathode of the diode D3 is connected to one end of the resistance R3, and the other end of the resistance R3 is connected to an anode of the diode D2 and one end of the switch (third switch) S3. The other end of the switch S3 is connected to the ground through a resistance R5, and an input terminal of a sample and hold circuit 2.

Meanwhile, the other end of the switch S2 is connected to negative electrode terminals (lower-side terminals in FIG. 1) of the capacitors C0 and C1 that form the flying capacitor 1 through a resistance R2, and one end of the switch (fourth switch) S4. The other end of the switch S4 is connected to the ground through a resistance R4.

An output of the sample and hold circuit 2 is connected to an input terminal of an A/D converter (illustrated by A/D in the drawing) included in the microcomputer 3, and a voltage temporarily held in the sample and hold circuit 2 is measured in the microcomputer 3 through the A/D converter, as a measured voltage.

Note that the microcomputer 3 is configured to operate as a measurement and calculation unit (measurement and calculation means) that calculates the output voltage of the direct-current power supply, and the ground fault resistance RL that is a composition of the ground fault resistances Rp and Rn, from the measured voltage, corresponding to a measurement mode described below.

In the configuration of the present embodiment described above, the positive electrode terminal of the capacitor C1 is not connected to the positive electrode terminal of the capacitor C0 when the switch S0 is OFF, the capacitors C0 and C1 configuring the flying capacitor 1. Therefore, the capacitance of the capacitor C0 becomes the capacitance of the flying capacitor 1.

Meanwhile, when the switch S0 is ON, the positive electrode terminal of the capacitor C1 is connected to the positive electrode terminal of the capacitor C0 through the switch S0. At this time, as described above, the negative electrode terminal of the capacitor C0 and the negative electrode terminal of the capacitor C1 are electrically connected. Therefore, the capacitor C1 is connected to the capacitor C0 through the switch S0 in parallel, and a summed-up (added) capacitance of the capacitance of the capacitor C0 and the capacitance of the capacitor C1 becomes the capacitance of the flying capacitor 1.

As described above, ON/OFF control of the switch S0 is controlled by the microcomputer 3. Therefore, the microcomputer 3 can control the capacitance of the flying capacitor 1 according to a measurement mode. Further, the capacitance of the capacitor C1 is larger than that of the capacitor C0. Therefore, the capacitance of the flying capacitor 1 can be increased/decreased in a large manner.

Further, in the insulation detecting device of the present embodiment, it is favorable that the capacitance of the capacitor C1 is about a capacitance of a conventional flying capacitor (for example, 1 µF or more), and the capacitance of the capacitor C0 is equal to or less than at least the capacitance of the capacitor C1. That is, it is favorable that the capacitance of the flying capacitor 1 at ON of the switch S0 is half or less, by OFF of the switch S0. Further, it is favorable to use the capacitors C0 and C1 having capacitances, with which the capacitance of the flying capacitor 1 at ON of the switch S0 becomes about 1/10 the capacitance by OFF of the switch S0.

Note that, in charging of the flying capacitor 1 in second and third paths described below, electric charges are transferred from the Y capacitors 4 and 5 to the flying capacitor 1 at the time of forming the paths, and a voltage range that can be detected in the second and third paths is decreased.

Hereinafter, an influence of the second path that turns the switches S1 and S4 ON will be described in detail. Note that, for simplification of the description, a case where only the electric charge stored in the Y capacitor 4 (referred to as electric charge amount Qy) by ON of the switches S1 and S4 is transferred to the flying capacitor 1, that is, a case where no supply of the electric charge from the direct-current power supply ("high voltage +" illustrated in FIG. 1) will be described. Further, influences of the diode D1 arranged between the Y capacitor 4 and the flying capacitor 1, and between the flying capacitor 1 and the ground, and of the resistances R1 and R4 are omitted.

Note that, in the description below, the capacitance of the capacitor C0 is C0, the capacitance of the capacitor C1 is C1 (note that $C1=10 \times C0$), and the capacitance of the Y capacitor 4 is Cy.

First, in FIG. 1, when the switch 0 is OFF, and the switches S1 to S4 are OFF, only the Y capacitors 4 and 5 are charged by the high voltage + or the high voltage − (direct-current power supply), and a predetermined electric charge Q is stored in the Y capacitors 4 and 5. Further, the flying capacitor 1 (capacitor C0) is after discharging, and the electric charge stored in the capacitor is 0 (zero).

Next, when the switches S1 and S4 are turned ON (note that the switch 0 is OFF), a part of the electric charge Qy stored in the Y capacitor 4 is transferred to the capacitor C0 that configures the flying capacitor 1, through the switch S1. At this time, when the voltage between the terminals of the Y capacitor 4 and the voltage between the terminals of the capacitor C0 become equal, transfer of the electric charge is stopped. The voltage at this time is a voltage Va, the electric charge amount stored in the Y capacitor 4 is Qa, and the electric charge amount stored in the capacitor C0 is Qb.

In this case, the electric charge stored in the Y capacitor 4 is transferred when the switches S1 and S4 are OFF, and thus the electric charge amounts Qy, Qa, and Qb satisfy the following formula (1):

$$Qy=Qa+Qb \quad (1)$$

Meanwhile, the voltage between the terminals of the Y capacitor 4 and the voltage between the terminals of the capacitor C0 become equal, and thus the voltage Va satisfies $Va=Qa/Cy=Qb/C0$, and the electric charge amounts Qa and Qb of the Y capacitor 4 and the capacitor C0 satisfy the following formula (2):

$$Qa=Cy \times Va, \ Qb=C0 \times Va \quad (2)$$

Therefore, the following formula (3) is obtained from the formulas (1) and (2), and the voltage Va of when the switch S0 is OFF satisfies the following formula (4):

$$Qy=Cy \times Va+C0 \times Va=(Cy+C0) \times Va \quad (3)$$

$$Va=Qy/(Cy+C0) \quad (4)$$

Similarly, the voltage Vb of when the switches S1 and S4 are turned OFF in a state where the switch S0 is turned ON satisfies the following formula (5):

$$Vb=Qy/(Cy+(C0+C1)) \quad (5)$$

Here, $C1=10 \times C0$, and thus the formula (5) becomes the following formula (6):

$$Vb=Qy/(Cy+11 \times C0) \quad (6)$$

Therefore, from the formulas (4) and (6), a ratio Va/Vb of the voltage Vb and the voltage Va satisfies the following formula (7):

$$Va/Vb = (Qy/(Cy+C0))/(Qy/(Cy+11 \times C0)) \quad (7)$$
$$= (Cy+11 \times C0)/(Cy+C0)$$

As is clear from the formula (7), when the capacitance C0 of the capacitor C0 is small and is about the capacitance Cy that is similar to the Y capacitors 4 and 5, for example, the formula (7) becomes Va/Vb=(12×C0)/(2×C0)=6 when the switch 0 is OFF, and an initial voltage of the flying capacitor 1 by the electric charge transferred from the Y capacitor 4 becomes 6 times the voltage of when the switch 0 is ON. Note that the same applies to the third path that turns the switches S2 and S3 ON.

As described above, when the capacitance of the flying capacitor 1 is small even after all of the electric charge of the flying capacitor 1 is discharged to 0 (zero), the initial voltage of the flying capacitor 1 by the electric charge transferred from the Y capacitor 4 in association with ON of the switches S1 and S4 becomes higher than that of when the capacitance is large. As a result, when a lower voltage than the initial voltage is applied to the flying capacitor 1, the initial voltage is measured as an applied voltage to the flying capacitor 1, and the lower applied voltage than the initial voltage is masked. This influence of the electric charge transferred from the Y capacitors 4 and 5 becomes more prominent when the capacitance of the flying capacitor 1 is small than when the capacitance is large, as is clear from the formula (7).

Meanwhile, when the ground fault resistances Rp and Rn are large, the voltage applied to the flying capacitor 1 becomes small. Therefore, when the ground fault resistances Rp and Rn are large and the voltage applied to the flying capacitor 1 is small, the voltage measured as a charged voltage of the flying capacitor 1 becomes a voltage caused by the electric charges transferred from the Y capacitors 4 and 5. Therefore, the ground fault resistance in a region where the ground fault resistances Rp and Rn are large and the voltage applied to the flying capacitor 1 is small cannot be measured.

For example, a detection range of the ground fault resistance RL becomes about several hundreds of kΩ to 0.5 MΩ when the capacitance of the flying capacitor 1 is several tenths of μF, while the detection range of the ground fault resistance RL is several hundreds of KΩ to several MΩ when the capacitance of the flying capacitor 1 is several μF, where the respective capacitances of the Y capacitors 4 and 5 are several tenths of μF. That is, when the capacitance of the flying capacitor 1 is several tenths of μF, the ground fault resistance RL is measured to be 500 kΩ even if the actual ground fault resistance RL is 500 kΩ or more.

Therefore, it is necessary that the capacitance of the capacitor C0 in the present embodiment is equal to or more than the capacitances of the Y capacitors 4 and 5. Therefore, usually, the capacitances of the Y capacitors 4 and 5 are equal to or less than several tenths of μF, and thus the capacitance of the capacitor C1 is favorably about several μF, and the capacitance of the capacitor C0 is favorably about several tenths of μF.

With such capacitances of the capacitors C0 and C1, the insulation detecting device of the present embodiment can switch and execute, by ON/OFF of the switch S0, measurement of the ground fault resistance RL and measurement of the output voltage of the direct-current power supply with the capacitance of the flying capacitor, which is similar to a conventional one, and the measurement of the ground fault resistance RL and measurement of the output voltage of the direct-current power supply with the capacitance of the flying capacitor, which is half or less than the conventional one.

When the capacitance of the flying capacitor 1 is small, the flying capacitor 1 can be charged in a shorter time than a conventional one, and a time to discharge the charged electric charge can be short, that is, a time required to charge/discharge the flying capacitor can be shortened. Therefore, a time required for the measurement of the ground fault resistance RL and the measurement of the output voltage of the direct-current power supply can be substantially shortened, and a time from occurrence of abnormality of the voltage of the direct-current power supply to detection of the abnormality and time from occurrence of ground fault to detection of the ground fault can be substantially shortened. As a result, reliability of a high voltage unit to which a high voltage up to a load is applied from the direct-current power supply can be improved.

Meanwhile, when the capacitance of the flying capacitor 1 is large, a large amount of electric charge can be charged in the flying capacitor 1, similarly to a conventional one. Therefore, measurement of the ground fault resistance RL with high measurement accuracy, where the influences of the Y capacitor and the like are substantially decreased, becomes possible.

Further, the capacitor C0 has the small capacitance, and thus a highly accurate and highly stable capacitor can be more easily used for the capacitor C0 than for the capacitor C1. By use of such a highly accurate and highly stable capacitor, high accurate measurement becomes possible even if V0f measurement described below without full charge is performed. Note that the capacitor C0 can have the above-described effect even with a configuration not using the highly accurate and highly stable capacitor.

Figure 2A:
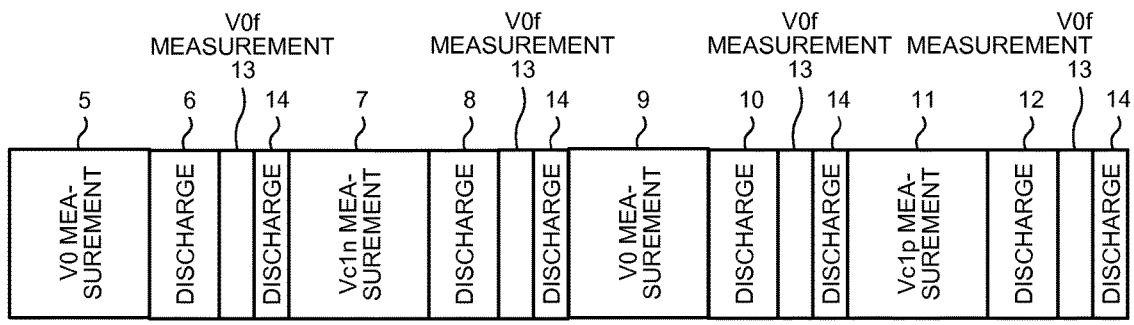
FIGS. 2A to 2C are diagrams for describing measurement operations in the insulation detecting device of the present embodiment.
Figure 2B:
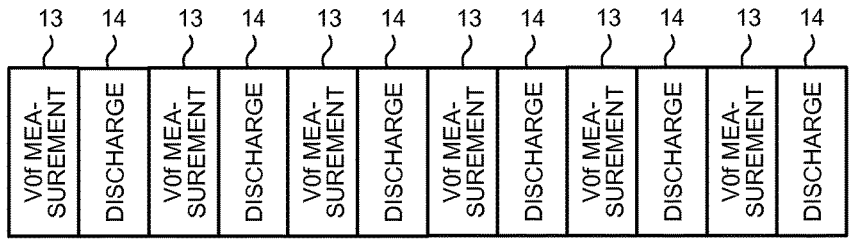
Figure 2C:
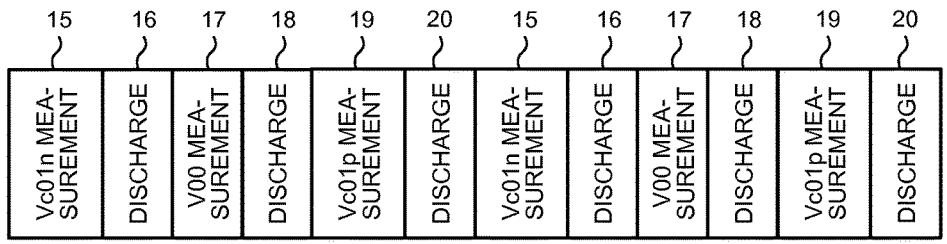

Next, FIGS. 2A to 2C illustrate diagrams for describing measurement operations in the insulation detecting device of the present embodiment, and hereinafter, operations of when the capacitance of the flying capacitor is switched will be described with reference to FIGS. 2A to 2C. Note that FIG. 2A is a diagram illustrating a measurement operation of when an operation to turn the switch S0 ON and measure the voltage of the direct-current power supply and the ground fault resistance RL, and an operation to turn the switch S0 OFF and fully charge the capacitor C0, and measure the voltage of the direct-current power supply are combined. FIG. 2B is a diagram illustrating a measurement operation of when the switch S0 is turned OFF and the capacitor C0 is fully charged, and the voltage of the direct-current power supply is measured. FIG. 2C is a diagram illustrating a measurement operation of when the switch S0 is turned OFF, and the voltage of the direct-current power supply and the ground fault resistance RL are measured. Note that the measurement illustrated in FIGS. 2A to 2C illustrates a part of continuously repeated measurement. Also, appropriately combined measurement from the measurement illustrated in FIGS. 2A to 2C may be employed.

V0 measurement, V0f measurement, Vc1n measurement, and Vc1p measurement

In the operation to detect the voltage measurement of the direct-current power supply and the ground fault resistance RL illustrated in FIG. 2A, first, as V0 measurement 5, after the switch S0 is turned ON, the switches S1 and S2 are kept ON during a predetermined period t1. Accordingly, a first path from the high voltage + (the positive electrode of the direct-current power supply) to the high voltage − (the negative electrode of the direct-current power supply) through the diode D1, the resistance R1, the flying capacitor 1, and the resistance R2 is formed, and the flying capacitor 1 is charged with the voltage of the direct-current power supply during the period t1. At this time, the switch S0 is ON, the capacitance of the flying capacitor 1 becomes a capacitance of the capacitor C0 and the capacitor C1, which are connected in parallel. Therefore, the period t1 is favorably a period sufficient for charging the added capacitance of the capacitance of the capacitor C0 and the capacitance of the capacitor C1, i.e., about is (seconds) of a charge time constant.

Next, after the period t1 of the V0 measurement 5 has passed, as a period of measurement and discharge 6, the switches S1 and S2 are turned OFF, and after that, the switches S3 and S4 are kept ON during a predetermined period t2. Accordingly, a fourth path from the one end side of the flying capacitor 1 (the upper side in FIG. 1, at the positive electrode side) to the ground through the diode D3, the resistance R3, and the resistance R5, and from the other end side of the flying capacitor 1 (the lower side in FIG. 1, at the negative electrode side) to the ground through the resistance R4 is formed, and the voltage charged in the flying capacitor 1 is discharged during a predetermined period t2. Note that, in the period of measurement and discharge 6, ON of the switch S0 is maintained, and the period t2 is favorably a period sufficient for discharging the voltage charged in the period t1 to 0 V (zero volt), i.e., about the charge time constant τ×5 s.

Further, in the insulation detecting device of the present embodiment, similarly to a conventional one, in the beginning of ON of the switches S3 and S4, that is, in the beginning of start of the period of discharge 6, the charged voltage of the flying capacitor 1 divided in the resistances R3 and R5 is held in the sample and hold circuit 2, and the held voltage is measured in the known A/D convertor of the microcomputer 3, as a measured voltage V0 of the V0 measurement 5, and the measured voltage is held as the measured voltage V0.

Next, after the period t2 of the discharge 6 has passed, the switches S3 and S4 are turned OFF. After that, as V0$f$ measurement 13, the switch S0 is turned OFF, and then the switches S1 and S2 are kept ON during a predetermined period t3. Accordingly, again, the first path from the high voltage + to the high voltage − through the diode D1, the resistance R1, the flying capacitor 1, and the resistance R2 is formed, and during the period t3, the flying capacitor 1 is charged with the voltage of the direct-current power supply. At this time, the switch S0 is OFF, and thus the capacitance of the flying capacitor 1 becomes the capacitance of the capacitor C0. In the V0$f$ measurement 13, the flying capacitor 1 of only the capacitor C0 is charged in the period t3 that is sufficient to fully charge (including approximately fully charge) the capacitance of the capacitor C0.

In the V0$f$ measurement 13, the flying capacitor 1 is fully charged, and thus the voltage charged in the flying capacitor 1 becomes the same voltage (approximately the same voltage) as the output voltage of the direct-current power supply. In this case, the voltage charged in the flying capacitor 1 is not subject to influences of variation of a charging current in association with variation of the resistances R1 and R2 in the first path (charging path), variation of a parasitic resistances and parasitic capacitances of the switches S1 and S2, variation of a charging current associated with variation of charge/discharge characteristics associated with variation of the Y capacitors 4 and 5 of each V0$f$ measurement 13, and the like. As a result, accuracy (absolute value accuracy) of a measured voltage V0$f$ measured in a period of discharge 14 described below can be higher than measured voltages V0 measured in V0 measurement 5 and 9 that is subject to the influences of the variation.

Next, after the period t3 of the V0$f$ measurement 13 has passed, as a period of measurement and discharge 14, the switches S1 and S2 are turned OFF, and after that, the switches S3 and S4 are kept ON during a predetermined period t4. Accordingly, the fourth path is formed, and during the predetermined period t4, the voltage charged in the flying capacitor 1 is discharged, and the voltage divided in the resistances R3 and R5 is measured in the microcomputer 3 in the beginning of ON of the switches S3 and S4, as a measured voltage C0$f$ of the V0$f$ measurement 13.

At this time, the measured voltage V0$f$ becomes a voltage obtained such that the fully charged voltage of the flying capacitor 1 is divided by the resistance R3 and the resistance R5. Therefore, an estimated output voltage V0$fs$ of the direct-current power supply is calculated from the measured voltage V0$f$, based on the following formula (8):

$$V0=V0f=V0fs \times R5/(R3+R5) \qquad (8)$$

Note that, in the V0$f$ measurement 13, relationship between the measured voltage V0$f$ and the estimated output voltage V0$fs$ in the V0$f$ measurement is stored as a table data, based on the formula (8), in advance, and the estimated output voltage V0$fs$ may be calculated by reference to the table data, based on the measured voltage V0$f$.

Further, in a period of measurement and discharge 14, the capacitance of the flying capacitor 1 becomes the capacitance of the capacitor C0. Therefore, a discharge period shorter than the period t2 of the measurement and discharge 6 following the V0 measurement 5 is sufficient. As a result, the total of the period t3 of the V0$f$ measurement 13 and the period t4 of the measurement and discharge 14 following the V0$f$ measurement 13 becomes an extremely shorter period than the total of the period t1 of the V0 measurement 5 and the period t2 of the measurement and discharge 6 following the V0 measurement 5. Further, an effect to improve the measured voltage V0$f$ that is a measured output voltage of the direct-current power supply can be obtained.

In addition, the absolute value accuracy of the measured voltage V0$f$ can be made high. Therefore, an effect to enhance the absolute value accuracy of the estimated output voltage V0$fs$ of the direct-current power supply can be obtained. As a result, an effect to improve accuracy of monitoring of the output voltage of the direct-current power supply, which is performed based on the estimated output voltage V0$fs$ of the direct-current power supply, can be obtained.

Next, after the period t4 of the discharge 14 has passed, the switch S3 is turned OFF, and as Vc1$n$ measurement 7, the switch S0 is turned ON, and then the switch S1 is kept ON during the predetermined period t1 that is the same as the V0 measurement 5. Accordingly, the second path from the high voltage + to the ground through the diode D1, the resistance R1, the flying capacitor 1, and the resistance R4, and from the high voltage − to the ground through the ground fault resistance Rn is formed, and the flying capacitor 1 is charged with the second path during the period t1. At this time, the switch S0 is ON, and thus the capacitance of the flying capacitor 1 becomes the capacitor of the capacitor C0 and the capacitor C1, which are connected in parallel. Note that the reason why the period (charge period) of the Vc1$n$ measurement 7 (including Vc1$p$ measurement 11 is caused to the same period as the period t1 of the V0 measurement 5 is that the same charge/discharge characteristics can be obtained in the Vc1$n$ measurement 7 (including Vc1$p$ measurement 11) and the V0 measurement 5. Therefore, the period of the Vc1$n$ measurement 7 is not limited to t1, and may be another period. However, the period of the Vc1$n$ measurement 7 is favorably the same period as the period of the last V0 measurement 5 or the period of the Vc1$p$ measurement 11.

Next, after the period t1 of the Vc1$n$ measurement 7 has passed, as a period of discharge 8 (including measurement), the switch S1 is turned OFF, and the switch S3 is then turned ON. Accordingly, the fourth path is formed, and during the predetermined period t2, the voltage charged in the flying capacitor 1 is discharged, and the voltage divided in the resistances R3 and R5 is measured in the microcomputer 3 and is held as a measured voltage Vc1$n$ of the Vc1$n$ measurement 7, in the beginning of ON of the switch S3.

After the period t2 of the discharge 8 has passed, the switches S3 and S4 are turned OFF. Following that, again, the V0$f$ measurement 13, and measurement and discharge 14 following the V0$f$ measurement 13 are performed. Further, similarly to the above, the measured voltage V0$f$ is measured, and the estimated output voltage V0$fs$ of the direct-current power supply is calculated by calculation of the formula (8), based on the measured voltage V0$f$.

After the period t4 of the discharge 14 has passed, the switches S3 and S4 are turned OFF. Following that, again, V0 measurement 9, and measurement and discharge 10 following the V0 measurement 9 are performed, and the measured voltage V0 corresponding to the V0 measurement 9 is measured and held, similarly to the above-described V0 measurement 5, and measurement and discharge 6 following the V0 measurement 5.

Next, after the period t2 of the discharge 10 corresponding to the V0 measurement 9 has passed, the switches S3 and S4 are turned OFF. Following that, again, the V0$f$ measurement 13, and measurement and discharge 14 following the V0$f$ measurement 13 are performed. Here, similarly to the above description, the measured voltage V0$f$ is measured, and the estimated output voltage V0$fs$ of the direct-current power supply is calculated by calculation of the formula (8), based on the measured voltage V0$f$.

After the period t4 of the discharge 14 has passed, the switch S4 is turned OFF, and following that, as the Vc1$p$ measurement 11, the switch S0 is turned ON, and then the switch S2 is kept ON during the predetermined period t1 that is the same as the V0 measurement 5. Accordingly, the third path from the high voltage + to the ground through the ground fault resistance Rp, and from the ground to the high voltage − through the resistance R5, the diode D2, the flying capacitor 1, and the resistance R2 is formed, and the flying capacitor 1 is charged with the third path during the period t1. At this time, the switch S0 is ON, and thus the capacitance of the flying capacitor 1 becomes the capacitance of the capacitor C0 and the capacitor C1, which are connected in parallel. Note that the period of the Vc1$p$ measurement 11 is not limited to t1, and may be another period. However, the period of the Vc1$p$ measurement 11 is favorably the same period as the period of the last V0 measurement 9 or the period of the Vc1$n$ measurement 7, similarly to the Vc1$n$ measurement 7.

Next, after the period t1 of the Vc1$p$ measurement 11 has passed, as a period of measurement and discharge 12, the switch S2 is turned OFF, and then the switch S4 is turned ON. Accordingly, the fourth path is formed, and during the predetermined period t2, the voltage charged in the flying capacitor 1 is discharged, and the voltage divided in the resistances R3 and R5 is measured in the microcomputer 3 in the beginning of ON of the switch 4, as a measured voltage Vc1$p$ of the Vc1$p$ measurement 11.

Following that, a ratio of Vc1$n$+Vc1$p$ and V0 is calculated in the microcomputer 3 by the following formula (9), based on the measured voltage V0 in the V0 measurement 5 and 9, the measured voltage Vc1$n$ in the Vc1$n$ measurement 7, and the measured voltage Vc1$p$ in the Vc1$p$ measurement 11, and the ground fault resistance RL formed according to the ground fault resistance Rp and the ground fault resistance Rn, that is, the ground fault resistance RL that is a composition of the ground fault resistance Rp and the ground fault resistance Rn, is calculated by reference to the table data, based on the calculation result.

$$(Vc1n + Vc1p)/V0 \tag{9}$$

Note that, in the period of measurement and discharge 8 after the Vc1$n$ measurement 7, Vc1$n$/V0 is calculated based on the measured voltage Vc1$n$ measured in the period of the measurement and discharge 8, and the measured voltage V0 measured in the period of the measurement and discharge 6 after the V0 measurement 5. Next, in a period of measurement and discharge 12 after the Vc1$p$ measurement 11, Vc1$p$/V0 is calculated based on the measured voltage Vc1$p$ measured in the period of the measurement and discharge 12, and the measured voltage V0 measured in the period of the measurement and discharge 10 after the V0 measurement 9. The calculation result of the Vc1$p$/V0 and the calculation result of the Vc1$n$/V0 are added, and the composited ground fault resistance RL may be calculated by reference to the table data, based on the added result.

The above-described charging of the capacitor C1 up to the discharge 14 corresponding to the V0 measurement 5 to the V0$f$ measurement 13, and the measurement, discharge, and calculation of the voltage charged in the capacitor C1 are repeated, whereby calculation of the estimated output voltage V0$fs$ and the ground fault resistance RL of the direct-current power supply, that is, monitoring of the output voltage of the direct-current power supply, occurrence of the ground fault, and a state of insulation can be sequentially output to a higher control device, in real time.

Further, in the measurement operation of FIG. 2A, the V0$f$ measurement 13 having the high absolute value accuracy of the measured voltage V0$f$ and the high absolute value accuracy of the estimated output voltage V0$fs$ can be measured with high accuracy. Therefore, the insulation detecting device of the present embodiment can also serve as a voltage sensor that monitors the total voltage of a battery monitoring unit that monitors the voltages of battery cells that configure the direct-current power supply.

Repetition of V0$f$ Measurement

Next, an operation of when only the V0$f$ measurement, and the discharge (including the measurement) following the V0$f$ measurement are continuously repeated, and the estimated output voltage V0$fs$ of the direct-current power supply is calculated will be described with reference to FIG. 2B. Note that similar operation and calculation to the V0$f$ measurement 13 and the discharge 14 illustrated in FIG. 2A is performed in the V0$f$ measurement 13 and the discharge 14 illustrated in FIG. 2B.

As illustrated in FIG. 2B, first, as the V0$f$ measurement 13, after the switch S0 is turned OFF, the switches S1 and S2 are kept ON during the predetermined period t3. Accordingly, the first path is formed, and the flying capacitor 1 is charged with the voltage of the direct-current power supply during the period t3. In the V0$f$ measurement 13, as described above, the capacitance of the flying capacitor 1 becomes the capacitance of the capacitor C0, and the flying capacitor 1 of only the capacitor C0 is charged in the period t3 that is sufficient to fully charge (including approximately fully charge) the capacitance of the capacitor C0.

Next, after the period t3 of the V0$f$ measurement 13 has passed, as the period of discharge 14 (including measurement of the voltage V0$f$), the switches S1 and S2 are turned OFF, and then the switches S3 and S4 are kept ON during the predetermined period t4. Accordingly, the fourth path is formed, the measured voltage V0 is measured by the microcomputer 3, and the estimated output voltage V0fs of the direct-current power supply is calculated from the measured voltage V0f, based on the formula (8).

By repetition of the above-described V0f measurement 13, and the discharge 14 corresponding to the V0f measurement 13, a plurality of times of the measurement of the voltage V0f and calculation of the estimated output voltage V0fs of the direct-current power supply in a short time becomes possible.

At this time, as described above, in the V0f measurement 13, the flying capacitor 1 having only the capacitance of the capacitor C0 is fully charged, and the absolute value accuracy of the measured voltage V0f and the absolute value accuracy of the estimated output voltage V0fs of the direct-current power supply can be made high. Therefore, in the measurement operation of FIG. 2B, absolute value accuracy of the measured voltage V0f and the absolute value accuracy of the estimated output voltage V0fs can be made high. Therefore, the insulation detecting device of the present embodiment can also serve as a voltage sensor that monitors the total voltage of a battery monitoring unit that monitors the voltages of battery cells that configure the direct-current power supply.

V00 Measurement, Vc01n Measurement, and Vc01p Measurement

Next, an operation to detect the output voltage of the direct-current power supply and the ground fault resistance RL is performed when the switch S0 is turned OFF and the flying capacitor 1 of only the capacitor C0 is obtained will be described with reference to FIG. 2C. Note that other configurations of Vc01n measurement 15, V00 measurement 17, Vc01p measurement 19, and discharge 16, 18, and 20 illustrated in FIG. 2C, except the configuration of forming the flying capacitor 1 with the capacitor C0, and the periods t5 to t8 corresponding to the capacitance of the capacitor C0, are similar to a conventional insulation detecting device. Therefore, in the description below, the capacitance of the flying capacitor 1, and periods of the Vc01n measurement 15, V00 measurement 17, Vc01p measurement 19, discharge 16, 18, and 20 corresponding to the capacitance will be described in detail.

In the operation illustrated in FIG. 2C, first, as the Vc01n measurement 15, the switch S0 is turned OFF, the switches S1 and S4 are kept ON during a predetermined period t5, and the switches S2 and S3 are turned OFF. Accordingly, the second path is formed, and only the capacitor C0 that forms the flying capacitor 1 is charged with the second path during the period t5.

Next, after the period t5 of the Vc01n measurement 15 has passed, as a period (including the measurement) of the discharge 16, the switch S1 is turned OFF, and then the switch S3 is turned ON. Accordingly, the fourth path is formed, and during the predetermined period t6, the voltage charged in the flying capacitor 1 having the capacitance of only the capacitor C0 is discharged to 0 V, and the voltage divided in the resistances R3 and R5 is measured in the microcomputer 3 and is held as a measured voltage Vc01n of the Vc01n measurement 15, in the beginning of ON of the switch S3.

In the Vc01n measurement 15 and the discharge 16, the periods t5 and t6 are periods to charge/discharge the flying capacitor 1 having the capacitance of the capacitor C0. Therefore, the periods are shorter (smaller) than the periods t1 and t2 to charge/discharge the capacitor C1 having a larger capacitance than the capacitor C0.

Next, after the period t6 of the discharge 16 has passed, the switches S3 and S4 are turned OFF. Following that, as the V00 measurement 17, the switches S1 and S2 are kept ON during a predetermined period t7 in a state where the switch S0 is OFF. Accordingly, the first path is formed, and only the capacitor C0 that forms the flying capacitor 1 is charged with the first path during the period t7.

Next, after the period t7 of the V00 measurement 17 has passed, as a period (including the measurement) of the discharge 18, the switches S1 and S2 are turned OFF, and then the switches S3 and S4 are turned ON. Accordingly, the fourth path is formed, and during the predetermined period t8, the voltage charged in the flying capacitor 1 having the capacitance of only the capacitor C0 is discharged, and the voltage divided in the resistances R3 and R5 is measured in the microcomputer 3 and is held as a measured voltage V00 of the V00 measurement 17, in the beginning of ON of the switches S3 and S4.

Even in the V00 measurement 17 and the discharge 18, the periods t7 and t8 are periods to charge/discharge the flying capacitor 1 having the capacitance of the capacitor C0. Therefore, similarly to the Vc01n measurement 15 and the discharge 16, the periods are shorter than the periods t1 and t2 illustrated in FIG. 2A.

Next, after the period t8 of the discharge 18 has passed, the switch S4 is turned OFF. Following that, as the Vc01p measurement 19, the switch S2 is kept ON during the predetermined period t5 in a state where the switch S0 is OFF. Accordingly, the third path is formed, and only the capacitor C0 that forms the flying capacitor 1 is charged with the third path during the period t5.

Next, after the period t5 of the Vc01p measurement 19 has passed, as a period (including the measurement) of the discharge 20, the switch S2 is turned OFF, and then the switch S4 is turned ON. Accordingly, the fourth path is formed, and during the predetermined period t6, the voltage charged in the flying capacitor 1 having the capacitance of only the capacitor C0 is discharged to 0 V, and the voltage divided in the resistances R3 and R5 is measured in the microcomputer 3 and is held as a measured voltage Vc01p of the Vc01p measurement 19, in the beginning of ON of the switch S4.

Following that, a ratio of Vc01n+Vc01p and V00 is calculated by the following formula (10) in the microcomputer 3, based on the measured voltage V00 in the V00 measurement 17, the measured voltage Vc01n in the Vc01n measurement 15, and the measured voltage Vc01p in the Vc01p measurement 19, and the ground fault resistance RL that is a composition of the ground fault resistance Rp and the ground fault resistance Rn is calculated by reference to the table data, based on the calculation result.

$$(Vc01n+Vc01p)/V00 \qquad (10)$$

Here, the periods of the Vc01p measurement 19 and the discharge 20 are the periods t5 and t6, and thus are shorter (smaller) periods than the periods t1 and t2.

As described above, the operation illustrated in FIG. 2C is an operation to repeat the Vc01n measurement 15, V00 measurement 17, and Vc01p measurement 19 of the periods t5 to t8 that are shorter than the periods t1 and t2, and the discharge 16, 18, and 20.

Therefore, the operation illustrated in FIG. 2C can calculate the ground fault resistance RL composited at a high speed, compared with the measurement of when the switch S0 is turned ON, in which the V0 measurement, Vc1n measurement, and Vc1p measurement, and the discharge thereof are repeated.

As a result, prompt monitoring becomes possible in a case where detection of abnormality in a short time such as at the time of start of the vehicle (in the period immediately after ON of ignition) is needed. That is, the measurement mode is favorable for monitoring of the output voltage of the direct-current power supply and the ground fault resistance RL at the time of start of the vehicle (in the period immediately after ON of ignition). For example, when the capacitance of the capacitor C0 is 0.1 to 0.3 µF, and the capacitance of the capacitor C1 is about 1 µF, the Vc01$n$ measurement 15 to the discharge 20 can be possible in the period of the V0 measurement and the discharge thereafter of when the switch S0 is ON. That is, the measurement of the output voltage of the direct-current power supply and the measurement of the ground fault resistance RL can be completed, and thus the measurement mode is very effective.

As described above, in the insulation detecting device of the present embodiment, the flying capacitor 1 is composed of at least the two capacitors C0 and C1, and the one capacitor C1 is connected with the other capacitor C0 in parallel through the switch S0. Further, the capacitance of the capacitor C1 is similar to the capacitance (for example, 1 µF) of a conventional flying capacitor, and the capacitance of the capacitor C0 is a capacitance (favorably about 0.1 to 0.3 µF) that is equal to or smaller than the capacitance of the capacitor C1. Further, ON/OFF of the switch S0 is controlled by a switch control output (not illustrated) from the microcomputer 3, similarly to other switches S1 to S4. That is, with the ON/OFF of the switch S0 by the control output from the microcomputer 3, the capacitance of the flying capacitor 1 can be variably controlled by the case where the flying capacitor 1 is configured from only the capacitor C0, and the case where the flying capacitor 1 is configured from the capacitors C0 and C1, which are connected in parallel.

Therefore, measurement of a combination of the measurement with a small flying capacitor capacitance, that is, the measurement with a short time required for charge/discharge of the flying capacitor 1, and the measurement with a large flying capacitor capacitance, that is, the measurement with good measurement accuracy although the time required for charge/discharge of the flying capacitor 1 is long becomes possible.

As a result, an effect to easily switch the measurement of the output voltage of the direct-current power supply and the measurement of the ground fault resistance RL in a short time, and the measurement of the output voltage of the direct-current power supply and the measurement of the ground fault resistance RL with high accuracy, according to the situation, can be obtained, and the functions and performance of the insulation detecting device can be improved. Further, an effect to perform highly accurate measurement of the output voltage of the direct-current power supply in a short time can be obtained.

As described above, according to one aspect of the present invention, the flying capacitor includes one or a plurality of first capacitor, and one or plurality of second capacitor connected with the first capacitor in parallel, and a parallel cancellation switch arranged between the first capacitor and the second capacitor, and which performs parallel connection, and cancellation of the parallel connection, between the first capacitor and the second capacitor, and a capacitance of the flying capacitor is variably controlled by ON/OFF (turning on or turning off) of the parallel cancellation switch. That is, measurement in which the flying capacitor is formed of a small capacitance of only the other capacitor, and measurement in which the flying capacitor formed of a large capacitance of one capacitor and the other capacitor, which are connected in parallel, can be controlled by ON/OFF of the parallel cancellation switch.

Therefore, measurement of a combination of measurement with a small flying capacitor capacitance, that is, measurement with a short time required for charge/discharge of the flying capacitor, and measurement with a large flying capacitor capacitance, that is, measurement with good measurement accuracy although the time required for charge/discharge of the flying capacitor is long becomes possible. As a result, an effect to change the measurement of the ground fault resistance according to the situation can be obtained.

According to another aspect of the present invention, a first switch arranged between one end of the flying capacitor and a positive electrode of the direct-current power supply, a second switch arranged between the other end of the flying capacitor and a negative electrode of the direct-current power supply, a third switch arranged between the one end of the flying capacitor and the ground, and a fourth switch arranged between the other end of the flying capacitor and the ground, and the charged voltages of the flying capacitor charged with a first path, a second path, and a third path are measured by the measurement and calculation means with a fourth path, the first path being formed by turning ON of only the first and the second switches, the second path being formed by turning ON of only the first and the fourth switches, the third path being formed by turning ON of only the second and the third switches, and the forth path being formed by turning ON of only the third and the fourth switches, and the measurement and calculation means calculates the ground fault resistance, based on the measured voltages of the charged voltages charged in the flying capacitor in the first to the third paths. Therefore, calculation to correct variation of elements arranged in the first to the third paths and the like can be performed. Therefore, calculation accuracy of the ground fault resistance can be improved.

According to still another aspect of the present invention, the capacitance of the flying capacitor at a time of the cancellation of the parallel connection between the first capacitor and the second capacitor is half or less than the capacitance of the flying capacitor at a time of the parallel connection between the first capacitor and the second capacitor. Therefore, an effect to substantially shorten change of the capacitance of the flying capacitor at OFF of the parallel cancellation switch, that is, the measurement time can be obtained.

According to still another aspect of the present invention, the flying capacitor capacitance can be made small, and the time required for full charge of the flying capacitor can be shortened in the state where the parallel cancellation switch is OFF. Therefore, times required for full charge of the flying capacitor with the first path where only the first and the second paths are ON, measurement of the charged voltage of the flying capacitor by the measurement calculation unit in the fourth path where only the third and the fourth switches are ON and estimation of the output voltage of the direct-current power supply, based on the measurement value, and discharge of the voltage charged in the flying capacitor can be shortened. Therefore, an effect to highly accurately monitor the output voltage of the direct-current power supply in a short time can be obtained. Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An insulation detecting device comprising:
   a flying capacitor configured to hold a charged voltage; and
   a measurement and calculation unit configured to measure the charged voltage of the flying capacitor, and calculate a ground fault resistance formed between a direct-current power supply of a vehicle electrically insulated from a ground, and the ground, based on the measured voltage, wherein
   the flying capacitor includes one or a plurality of first capacitors, one or a plurality of second capacitors connected with the first capacitor in parallel, and a parallel cancellation switch arranged between the first capacitor and the second capacitor, and which performs parallel connection, and cancellation of the parallel connection, between the first capacitor and the second capacitor, and
   a capacitance of the flying capacitor is variably controlled by turning on or turning off of the parallel cancellation switch,
   wherein the first capacitor has a first capacitance and the second capacitor has a second capacitance greater than the first capacitance,
   wherein the insulation detecting device, in the case of a higher speed measurement mode including at the start of the vehicle when the parallel cancellation switch is turned off, monitors an output voltage of the direct current power supply and the ground fault resistance, and
   wherein the capacitance of the flying capacitor at a time of the cancellation of the parallel connection between the first capacitor and the second capacitor is less than the capacitance of the second capacitor.

2. The insulation detecting device according to claim 1, further comprising:
   a first switch arranged between one end of the flying capacitor and a positive electrode of the direct-current power supply;
   a second switch arranged between the other end of the flying capacitor and a negative electrode of the direct-current power supply;
   a third switch arranged between the one end of the flying capacitor and the ground; and
   a fourth switch arranged between the other end of the flying capacitor and the ground, wherein
   the charged voltages of the flying capacitor charged with a first path, a second path, and a third path are measured by the measurement and calculation unit with a fourth path, the first path being formed by turning on of only the first and the second switches, the second path being formed by turning on of only the first and the fourth switches, the third path being formed by turning on of only the second and the third switches, and the forth path being formed by turning on of only the third and the fourth switches, and
   the measurement and calculation unit calculates the ground fault resistance, based on the measured voltages of the charged voltages respectively charged in the flying capacitor in the first to the third paths.

3. The insulation detecting device according to claim 2, wherein
   the capacitance of the flying capacitor at a time of the cancellation of the parallel connection between the first capacitor and the second capacitor is less than half the capacitance of the flying capacitor at a time of the parallel connection between the first capacitor and the second capacitor.

4. The insulation detecting device according to claim 2, further comprising:
   a measurement mode configured to perform, in a state where the connection cancellation switch is kept off, full charge to the flying capacitor composed of only the first capacitor with the first path formed by turning on of the first and the second switches, measurement of the charged voltage of the flying capacitor fully charged with the fourth path formed by turning on of the third and the fourth switches, and calculation of an output voltage of the direct-current power supply, based on the measured voltage at the full charge measured by the measurement and calculation unit.

5. The insulation detecting device according to claim 3, further comprising:
   a measurement mode configured to perform, in a state where the connection cancellation switch is kept off, full charge to the flying capacitor composed of only the first capacitor with the first path formed by turning on of the first and the second switches, measurement of the charged voltage of the flying capacitor fully charged with the fourth path formed by turning on of the third and the fourth switches, and calculation of an output voltage of the direct-current power supply, based on the measured voltage at the full charge measured by the measurement and calculation unit.

6. The insulation detecting device according to claim 1, wherein
   the capacitance of the flying capacitor at a time of the cancellation of the parallel connection between the first capacitor and the second capacitor is less than half the capacitance of the flying capacitor at a time of the parallel connection between the first capacitor and the second capacitor.

7. The insulation detecting device according to claim 1, wherein
   the one or a plurality of first capacitors comprises a plurality of first capacitors, and
   the plurality of first capacitors has a combined capacitance less than the second capacitance of the second capacitor.

8. The insulation detecting device according to claim 7, wherein
   the one or a plurality of second capacitors comprises a plurality of second capacitors, and
   the plurality of second capacitors has a combined capacitance greater than the combined capacitance of the plurality of first capacitors.

* * * * *